United States Patent
Bih et al.

(10) Patent No.: US 10,354,965 B2
(45) Date of Patent: Jul. 16, 2019

(54) BONDING PAD PROCESS WITH PROTECTIVE LAYER

(71) Applicant: Taiwan Semiconductor Manufacturing Co., Ltd., Hsinchu (TW)

(72) Inventors: Shih Wei Bih, Taichung (TW); Chun-Chih Lin, Taipei (TW); Sheng-Wei Yeh, Taichung (TW); Yen-Yu Chen, Taichung (TW); Chih-Wei Lin, Hsinchu (TW); Wen-Hao Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/719,370

(22) Filed: Sep. 28, 2017

(65) Prior Publication Data

US 2019/0096834 A1    Mar. 28, 2019

(51) Int. Cl.
*H01L 23/52* (2006.01)
*H01L 23/00* (2006.01)

(52) U.S. Cl.
CPC ............ *H01L 24/05* (2013.01); *H01L 24/03* (2013.01); *H01L 2224/0345* (2013.01); *H01L 2224/0391* (2013.01); *H01L 2224/03614* (2013.01); *H01L 2224/03622* (2013.01); *H01L 2224/05025* (2013.01); *H01L 2224/05083* (2013.01); *H01L 2224/05124* (2013.01); *H01L 2224/05147* (2013.01); *H01L 2224/05181* (2013.01); *H01L 2924/04953* (2013.01)

(58) Field of Classification Search
CPC ......... H01L 24/05; H01L 24/11; H01L 24/03; H01L 24/27
USPC ........................................................ 257/773
See application file for complete search history.

(56) References Cited

U.S. PATENT DOCUMENTS

| | | | | |
|---|---|---|---|---|
| 5,937,320 A * | 8/1999 | Andricacos | ............. | H01L 24/03 257/E23.021 |
| 6,100,181 A * | 8/2000 | You | .................... | H01L 21/76834 257/E21.582 |
| 6,144,096 A * | 11/2000 | Lopatin | ............. | H01L 21/76843 257/737 |
| 6,352,921 B1 * | 3/2002 | Han | .................. | H01L 21/76807 257/E21.579 |
| 6,415,974 B2 * | 7/2002 | Jao | .......................... | H01L 24/03 228/180.22 |

(Continued)

*Primary Examiner* — Luan C Thai
(74) *Attorney, Agent, or Firm* — Sterne, Kessler, Goldstein & Fox P.L.L.C.

(57) ABSTRACT

The present disclosure describes an bonding pad formation method that incorporates an tantalum (Ta) conductive layer to block mobile ionic charges generated during the aluminum-copper (AlCu) metal fill deposition. For example, the method includes forming one or more interconnect layers over a substrate and forming a dielectric over a top interconnect layer of the one or more interconnect layers. A first recess is formed in the dielectric to expose a line or a via from the top interconnect layer. A conductive layer is formed in the first recess to form a second recess that is smaller than the first recess. A barrier metal layer is formed in the second recess to form a third recess that is smaller than the second recess. A metal is formed to fill the third recess.

20 Claims, 15 Drawing Sheets

(56) References Cited

U.S. PATENT DOCUMENTS

| | | | | |
|---|---|---|---|---|
| 6,500,750 | B1* | 12/2002 | Shroff | H01L 21/76807 |
| | | | | 257/E21.508 |
| 6,720,243 | B2* | 4/2004 | Weng | H01L 24/11 |
| | | | | 257/E21.508 |
| 7,834,454 | B2* | 11/2010 | Rinne | H01L 24/11 |
| | | | | 257/737 |
| 8,283,781 | B2* | 10/2012 | Wu | H01L 23/3157 |
| | | | | 257/738 |
| 8,435,868 | B2* | 5/2013 | Shigihara | H01L 21/6836 |
| | | | | 257/E21.214 |
| 8,592,977 | B2* | 11/2013 | Chou | H01L 23/53238 |
| | | | | 257/751 |
| 8,659,155 | B2* | 2/2014 | Cheng | H01L 24/11 |
| | | | | 257/737 |
| 2013/0307119 | A1* | 11/2013 | Chen | H01L 23/49822 |
| | | | | 257/532 |
| 2016/0163666 | A1* | 6/2016 | Yajima | H01L 24/08 |
| | | | | 257/773 |

* cited by examiner

BONDING PAD PROCESS WITH PROTECTIVE LAYER

BACKGROUND

Integrated circuit (IC) fabrication processing is performed successively in layers which are formed on top of each other over a substrate (e.g., a wafer). An IC may include a large numbers of layers (e.g., hundreds) depending on the design complexity and application. The layers are electrically connected to one another and, therefore, material processing performed in one layer may impact the electrical behavior of a structure that has been formed in another layer.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1A:
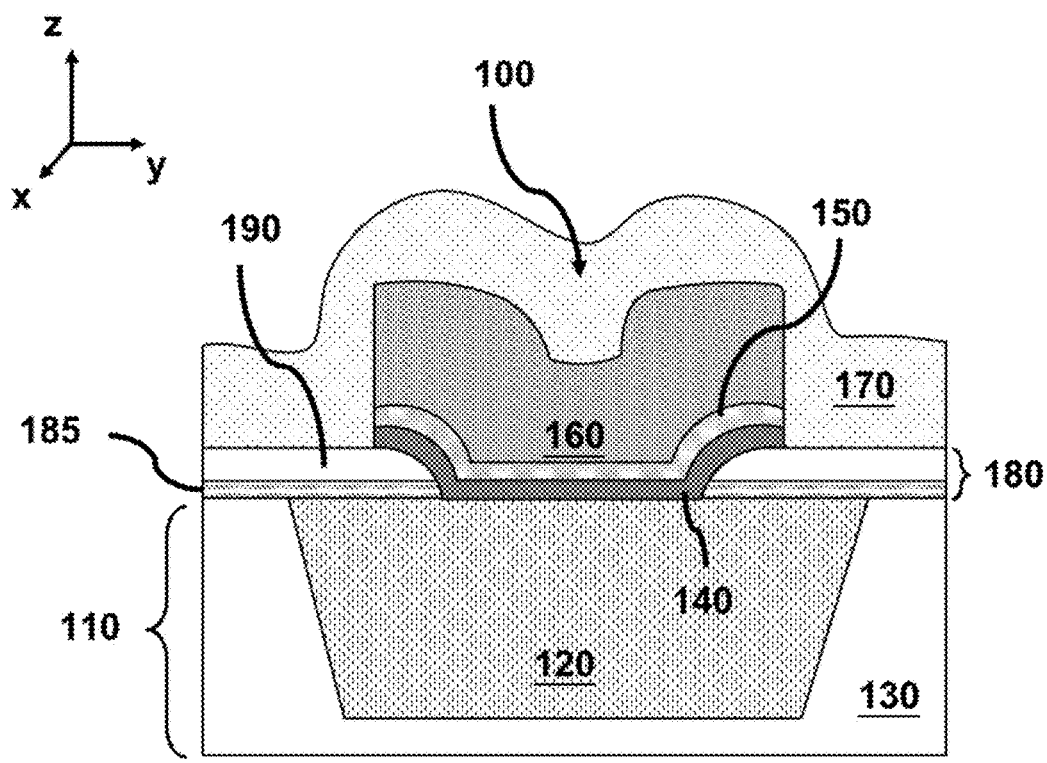
FIGS. 1A-B are cross-sectional views of a bonding pad structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances. Unless defined otherwise, technical and scientific terms used herein have the same meanings as commonly understood by one of ordinary skill in the art to which this disclosure belongs.

Integrated circuit (IC) fabrication processing is performed successively in layers which are formed on top of each other over a substrate (e.g., a wafer). At the end of the fabrication process, an IC may include multiple layers, or levels, (e.g., more than one hundred) depending on the complexity of the chip design and the application (e.g., mobile, automotive, computer, etc.). Since the layers are electrically connected to one another, a material process performed in one layer may impact the electrical behavior of a structure which has been formed in another layer. For example, material processes that involve plasmas (e.g., sputtering, plasma-assisted depositions, etch) may induce "mobile" ionic charges that can diffuse through electrical contacts (e.g., interconnects), or even dielectrics, to the lower levels of the IC and impact the operation of underlying devices (e.g., field effect transistors (FETs)). Mobile ionic charges are charges that can freely move or diffuse through dielectrics or conductors under certain conditions such as, for example, under the presence of an electric field or due to thermal energy.

For example, the aluminum-copper (AlCu) metal deposition process (e.g., during the formation of a bonding pad in the back-end of the line (BEOL)) may impact the electrical performance of FETs in the front end of the line (FEOL). In this example, mobile ionic charges, which can be generated during the AlCu metal sputter deposition process, can migrate to the FETs if the AlCu deposition is performed at temperatures higher than 250° C. Mobile ionic charge built up in the transistor's gate oxide can compromise its insulating performance (e.g., decrease its breakdown voltage and increase leakage current).

Breakdown voltage is a characteristic of a dielectric material that defines the maximum voltage that the dielectric material can withstand before the dielectric begins to conduct current in the form of leakage current. Current conduction through a dielectric material is not desired and can compromise an IC's reliability, shorten the IC's lifetime, and create irreversible material damages to the dielectric. To protect the gate oxide, AlCu processing may be limited to deposition temperatures below 250° C. and to a plasma power setting below 20 kW. However, such limitations can impact the AlCu process performance. For example, such process limitations can limit throughput and the AlCu gap fill properties.

Breakdown voltage measurements and leakage current measurements can be part of a standardized electrical test routine that can be performed to check the IC's performance after fabrication. Blocking mobile ionic charges that may compromise the transistors' performance is therefore desired in IC fabrication.

To address the above limitations, embodiments described herein are directed to a bonding pad formation method that includes a tantalum (Ta) conductive layer (e.g., between 2.5 Å to 30 Å) that can be deposited prior to the formation of the AlCu metal fill layer. The Ta conductive metal layer can block mobile ionic charges generated during the AlCu deposition process and mitigate the ionic charge's impact on gate oxide structures of underlying transistors. As a result, limitations on the subsequent AlCu process can be revised to improve gap fill and throughput performance.

FIG. 1A is a cross-sectional view of a bonding pad structure 100 over interconnect layer 110, according to some embodiments. By way of example and not limitation, interconnect layer 110 includes metal interconnect 120 and interlayer dielectric (ILD) 130. In some embodiments, interconnect layer 100 can include a plurality of metal interconnects 120 embedded in ILD 130. In some embodiments, additional interconnect layers over a substrate (not shown in FIG. 1) may exist below interconnect layer 110. In some embodiments, the substrate can be a bare semiconductor bulk wafer, a top layer of a semiconductor on insulator (SOI) wafer, or a partially (or fully) fabricated semiconductor wafer that includes previously formed layers—such as front end of the line (FEOL), middle of the line (MOL) and/or BEOL layers. By way of example and not limitation, the substrate can be made of be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, the substrate can be a non-semiconductor substrate such as, for example, quartz.

By way of example and not limitation, interconnect layer 110 is a BEOL interconnect layer with copper (Cu) metal interconnects 120. For illustration purposes, FIG. 1 includes select portions of actual structure and other portions (not shown) may be included. For example, a stack of tantalum nitride (TaN)/tantalum (Ta) formed between metal interconnect 120 and ILD 130 may be included. TaN is a barrier layer that prevents Cu diffusion into ILD 130. Ta can be used to provide a low resistivity adhesion surface for a Cu seed growth and Cu electroplating.

BEOL interconnect layers can include two types of metal interconnects: vertical interconnect access lines ("vias") and lateral lines ("lines"). The vias run through ILD 130 in a vertical direction (e.g., z-direction) and create electrical connections to layers above or below ILD 130. Lines are laid in the lateral direction (e.g., x- and y-directions) within ILD 130 to connect a variety of components within the same interconnect layer (e.g., interconnect layer 110). Interconnect layer 110 can include one or more vias and/or one or more lines. BEOL may include multiple interconnect layers (e.g., up to 9 or more) with vias and lines of increasing size (e.g., width) and pitch. Metal interconnect 120 can be either a line or a via.

In some embodiments, ILD 130 can be a low-k dielectric material. Low-k dielectric materials can have a dielectric constant (k-value) below 3 and a porous microstructure. The porous microstructure is achieved with the addition of a porogen, such as alpha-terpinene (ATRP). The addition of the porogen in the dielectric can be done during the dielectric deposition process. Low-k dielectric processing can involve an ultraviolet (UV) cure step which can reduce the k-value of the dielectric material. For example, the k-value of the dielectric can decrease during the cure step from about 3 to about 2.5, or below. The UV cure step can also improve the mechanical strength (hardness) of the low-k dielectric material. Low-k materials can reduce unwanted parasitic capacitances (e.g., due to their low k-value), and therefore mitigate resistance-capacitance (RC) delays and line/via cross-talk.

In some embodiments, bonding pad structure 100 can include conductive layer 140, barrier layer 150, and metal layer 160. In some embodiments, conductive layer 140 can be a Ta layer with a thickness range between 2.5 Å to 30 Å. Conductive layer 140 can be deposited with physical vapor deposition (PVD), e.g., sputtering. In some embodiments, barrier layer 150 can be a nitride, such as for example TaN. Barrier layer 150 can also be deposited with PVD. In some embodiments, conductive layer 140 (e.g., Ta) and barrier layer 150 (e.g., TaN) can be deposited in-situ. In some embodiments, the thickness of barrier layer 150 can range from about 20 nm to about 100 nm (e.g., 20 nm to 60 nm, 30 nm to 70 nm, 40 to 100 nm). In some embodiments, metal layer 160 can be a metal alloy such as AlCu with a copper (Cu) concentration between about 0.1 atomic percent (at. %) and about 1.5 at. %. In some embodiments, barrier layer 150 can prevent Cu diffusion. By way of example and not limitation, bonding pad structure 100 can be a square that extends in the x- and y-directions and has dimensions as large as 2×2 µm² or 3×3 µm². However, other dimensions can be possible and the above dimensions and layer thicknesses should not be considered limiting.

In FIG. 1A, layer 180 is deposited over metal interconnect 120 and ILD 130. In some embodiments, layer 180 can be a stack that includes a bottom etch-stop layer 185 and a top oxide layer 190. By way of example, and not limitation bottom etch-stop layer 185 can be made of silicon nitride (SiN) and top oxide layer 190 can be made of undoped silicate glass (USG)—also known as undoped oxide (UDOX). The thickness of the bottom etch-stop layer 185 can range from about 50 nm to about 100 nm and the thickness of the top oxide layer 190 can range from about 200 nm to about 400 nm. The bottom etch-stop layer 185 can be used as an etch-stop layer in a subsequent etch operation during the formation of bonding pad structure 100.

Bonding pad structure 100 can be covered by passivation layer 170. In some embodiments, passivation layer 170 can be a layer stack (e.g., up to about 200 nm or more) that includes a bottom USG layer (not shown in FIG. 1). and a top SiN layer (not shown in FIG. 1). Passivation layer 170 can protect bonding pad structure 100 and the underlying layers from scratches, contamination, and moisture according to some embodiments.

Figure 1B:
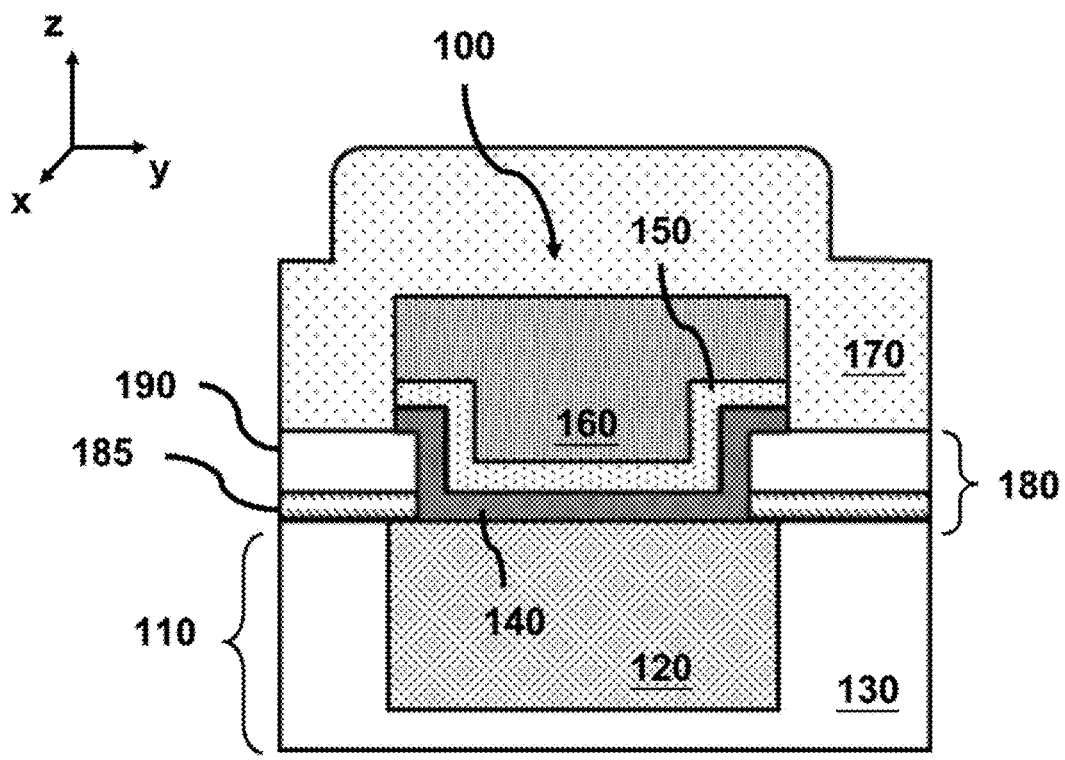

FIG. 1B is a cross-sectional view of a bonding pad structure 100 over interconnect layer 110, according to some embodiments. FIG. 1B is an alternative illustration of bonding pad structure 100 shown in FIG. 1A. In FIG. 1B, a conformal deposition method (e.g., a chemical vapor deposition (CVD) or atomic layer deposition (ALD) technique) can be used to form conductive layer 140 and barrier layer 150 with minimal overhang. Due to the conformal deposition method, the contours of conductive layer 140 and barrier layer 150 (and layers formed thereon) can be more conformal than the layers shown in FIG. 1A. For explanation purposes, the embodiments below are described in context of FIG. 1B. However, the embodiments disclosed herein are equally applicable to FIG. 1A, which is within the spirit and scope of this disclosure.

Figure 2:
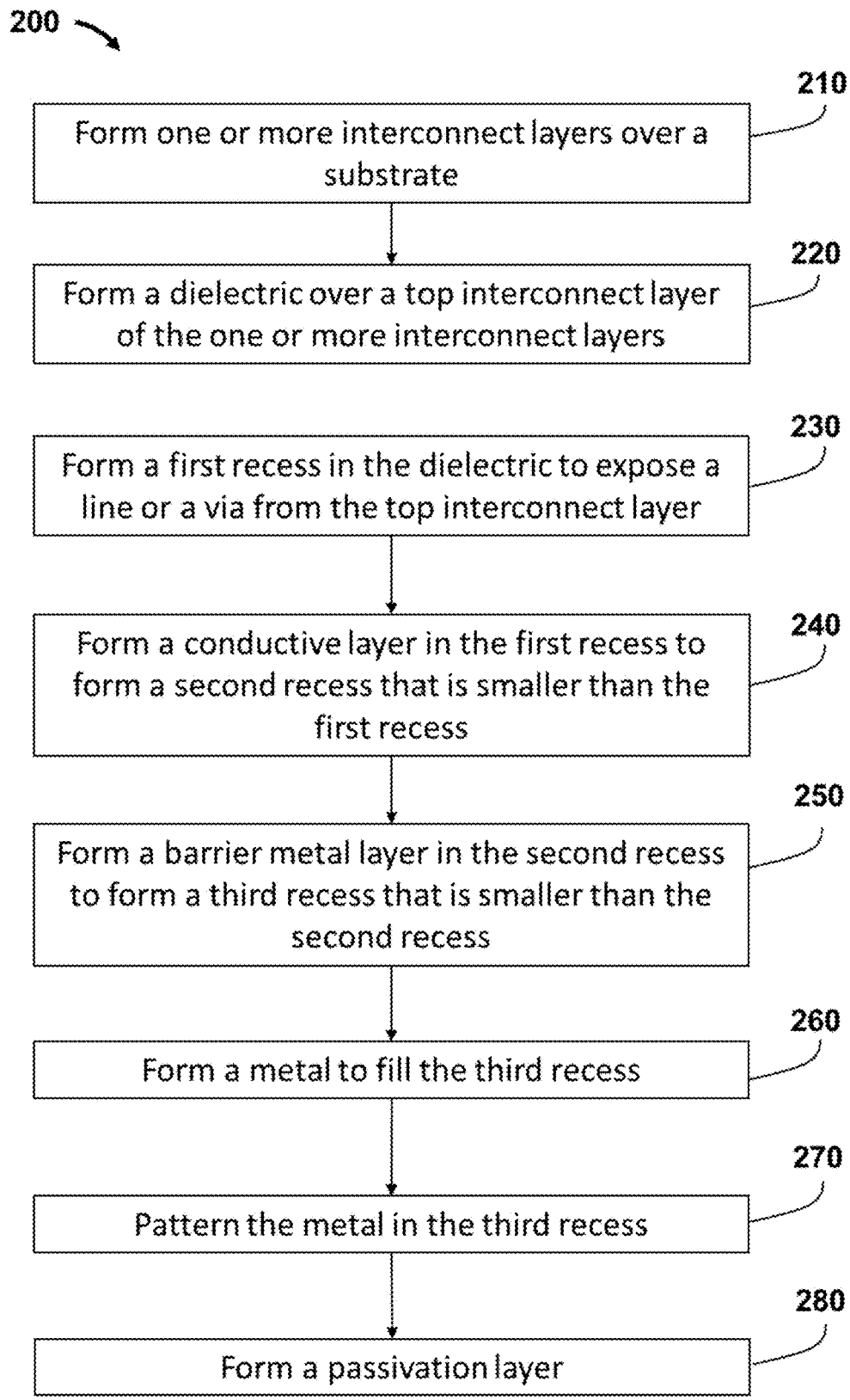
FIG. 2 is a flow chart that describes a bonding pad structure according to some embodiments.

FIG. 2 is a flow chart of a bonding pad fabrication method 200, where a conductive layer is formed to block mobile ionic charges generated during an AlCu alloy deposition process according to some embodiments. Other fabrication operations may be performed between the various operations of method 200 and are omitted for clarity. The method 200 may not be limited to the operations described below. The figures provided to describe method 200 are for illustrative purposes only and are not to scale. In addition, the figures may not reflect the actual geometry of the real structures, features, or films. Some structures, films, or geometries may have been deliberately augmented for illustrative purposes.

Figure 3:
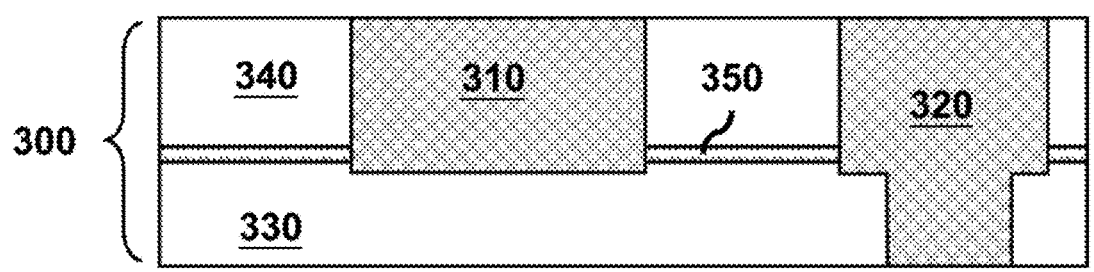
FIG. 3 is a cross-sectional view of an interconnect layer according to some embodiments.

Method 200 starts with operation 210 and the formation of one or more interconnect layers over a substrate. FIG. 3 shows a BEOL interconnect layer 300 which can include line 310 and via 320, ILD layers 330 and 340, and etch-stop layer 350. In some embodiments, interconnect layer 300 can include multiple vias and lines similar to via 320 and line 310. In some embodiments, interconnect layer 300 is over a substrate which is not depicted in FIG. 3. In some embodiments, interconnect layer 300 can be the top interconnect layer of a plurality of interconnect layers that have been formed over the substrate and are located below interconnect layer 300. In some embodiments, the substrate can be a bare semiconductor bulk wafer, a top layer of a semiconductor on insulator (SOI) wafer, a partially (or fully) fabricated semiconductor wafer that includes previously formed layers—such as front end of the line (FEOL), middle of the line (MOL) and/or BEOL layers. By way of example and not limitation, the substrate can be made of be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide(InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. In some embodiments, the substrate can be a non-semiconductor substrate such as, for example, quartz.

By way of example and not limitation, lines 310 and vias 320 are made of Cu. In some embodiments, ILD layers 330 and 340 can be low-k dielectrics with a porous microstructure and a k-value below 3 (e.g., 2.5). The porous microstructure is achieved with the addition of a porogen, such ATRP, during the dielectric deposition process. Low-k dielectric processing can involve a UV cure step that can reduce the k-value of the dielectric material—from about 3 to about 2.5, or below. The UV cure step can also improve the mechanical strength (hardness) of the low-k dielectric material. Low-k materials can reduce unwanted parasitic capacitances (e.g., due to their low k-value), and therefore mitigate RC delays and line/via cross-talk.

In some embodiments, etch-stop layer 350 is a SiN layer used during the etch process of line 310 and via 320.

Figure 4:
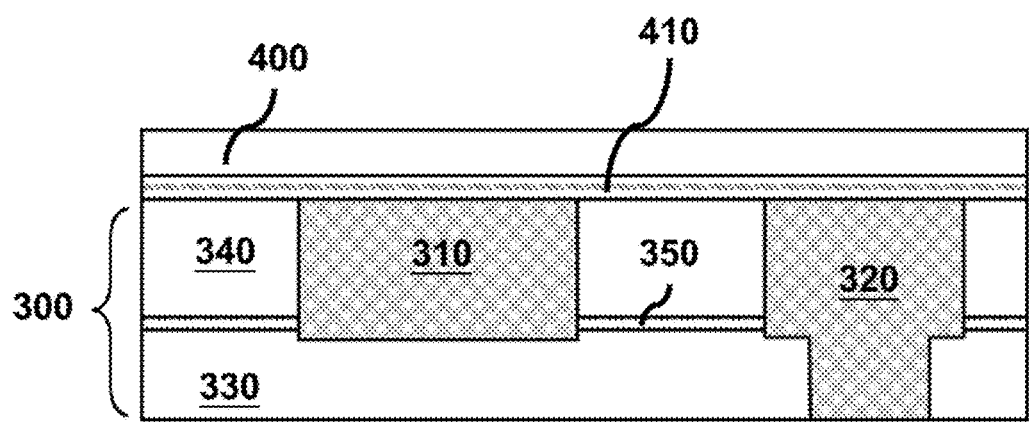
FIG. 4 is a cross-sectional view of an interconnect layer with an etch-stop layer and an interlayer dielectric layer according to some embodiments.

In referring to FIG. 2, method 200 continues with operation 220 and the formation of a dielectric over interconnect layer 300. In FIG. 4, a dielectric (e.g., ILD layer 400) is disposed over interconnect layer 300. In addition, etch-stop layer 410 is disposed between ILD layer 400 and interconnect layer 300. In some embodiments, etch-stop layer 410 can prevent oxidation of line 310 and via 320 during the formation of ILD layer 400. Additionally, etch-stop layer 410 can assist with the subsequent dry etch operations. In some embodiments, ILD layer 400 can be a USG layer with a thickness that can range from about 200 to about 400 nm, while etch-stop layer 410 can be a SiN layer with a thickness that can range from about 50 to about 100 nm. In some embodiments, the SiN layer can be deposited with a plasma-enhanced chemical vapor deposition (PECVD) using silane ($SiH_4$) and ammonia ($NH_3$) plasma. In some embodiments, USG can be deposited with PECVD or low pressure CVD (LPCVD) process using, by way of example and not limitation, $SiH_4$ and nitrous oxide ($NO_2$), $SiH_4$ and oxygen ($O_2$) or TEOS (tetraethoxysilane) and $O_2$.

In referring to FIG. 2, in operation 230, a first recess is formed in the dielectric (e.g., ILD layer 400) to expose a line or a via from the top interconnect layer (e.g., interconnect layer 300) according to some embodiments. A photolithography operation and a series of etch operations can be used to form the recess. For example, in FIG. 5, a coat of photoresist layer 510 is applied on ILD layer 400. Photoresist layer 510 can be spin coated over ILD layer 400. After the photoresist application, the wafer is subjected to an annealing step (also known as a "soft bake" or a "pre-bake"). A purpose of the pre-bake anneal is to remove any remaining solvent from the coated photoresist, improve the adhesion of the photoresist, and relieve the stress of the photoresist that occurred during the spin coating process.

Photoresist layer 510 is a compound that undergoes a change in solubility in a developer solution when exposed to an ultraviolet (UV) or extreme ultraviolet (EUV) light. A purpose of the photoresist layer 510 in semiconductor fabrication is to assist with a mask pattern transfer and therefore protect portions of the underlying material during subsequent processes (e.g., an etch). Photoresist layer 510 can be patterned according to a prescribed design layout so that a recess can be formed in ILD 400 and etch-stop layer 410 to expose a portion of line 310.

For example, photoresist layer 510 can be patterned by exposing different areas of the photoresist to UV or EUV light according to the pattern in a photomask (reticle). A post exposure bake can be applied to initiate a chemical reaction in photoresist layer 510. The chemical reaction can change the solubility of the exposed areas of photoresist layer 510. After the photoresist exposure operation, photoresist layer 510 is developed. During the develop step, photoresist layer 510 is exposed to a developer solution that dissolves the non-crosslinked areas in photoresist layer 510. Depending on the photoresist type (i.e., negative-tone or positive-tone), non-soluble areas in photoresist layer 510 could be the exposed or the non-exposed areas. After the develop step, the wafer can be rinsed with de-ionized water (DI) and dried. A post-development thermal bake (also known as a "hard bake") is performed to evaporate any residual solvent and to harden photoresist layer 510. Nominal hard bake temperatures for positive-tone and negative-tone resists can be about 130° C. and about 150° C., respectively.

Figure 5:
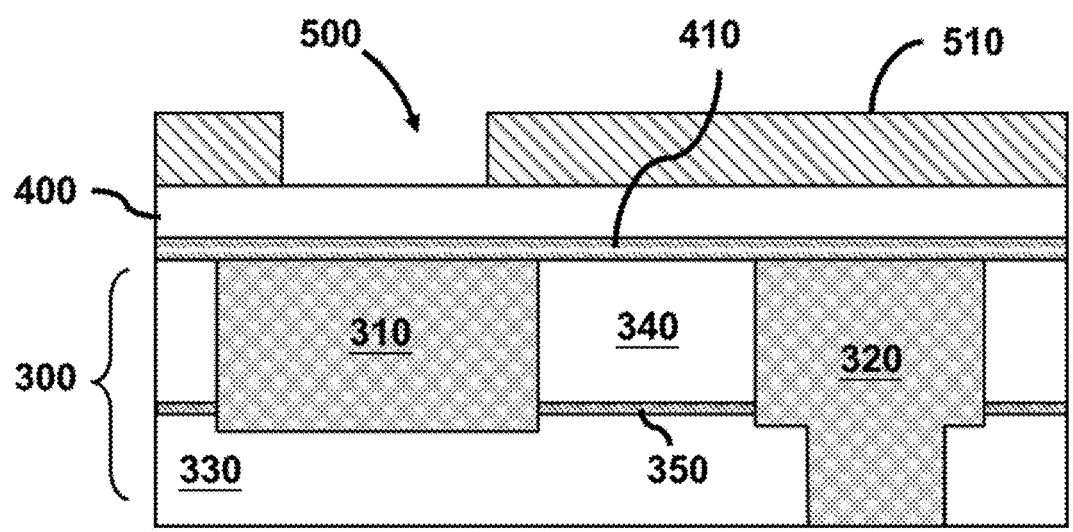
FIG. 5 is a cross-sectional view of an interconnect layer with a patterned photoresist layer according to some embodiments.
Figure 6:
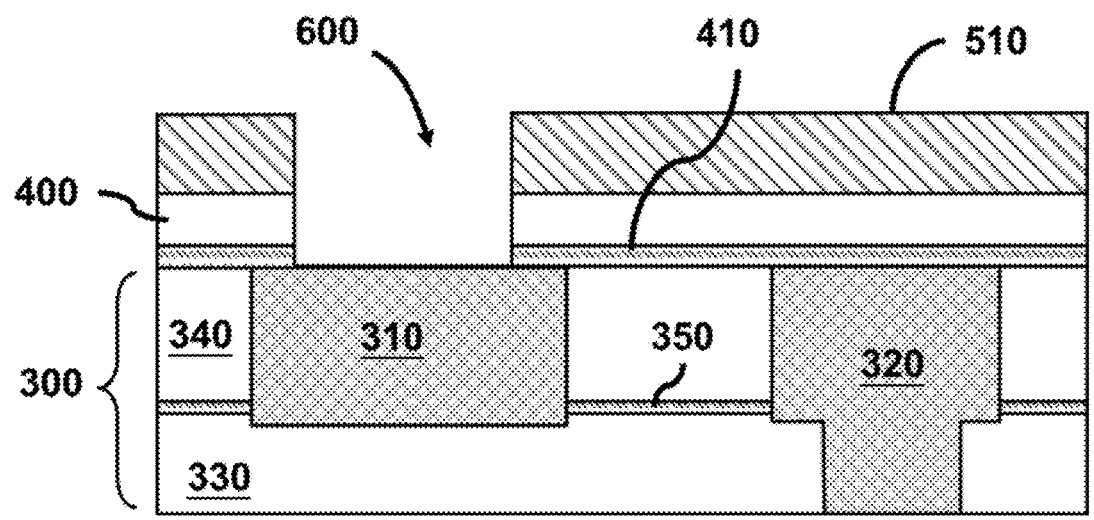
FIG. 6 is a cross-sectional view of an interconnect layer after an etch operation through a patterned photoresist layer according to some embodiments.

In FIG. 5, an opening 500 that exposes ILD 400 is formed in patterned photoresist layer 510. In some embodiments, a plurality of openings similar to opening 510 can be formed in other locations. A subsequent etch process removes exposed areas of ILD layer 400 and etch-stop layer 410, through photoresist opening 500, to form a recess. For example, FIG. 6 shows the formed recess, recess 600, in ILD layer 400 and etch-stop layer 410 after the etch operation.

Figure 7:
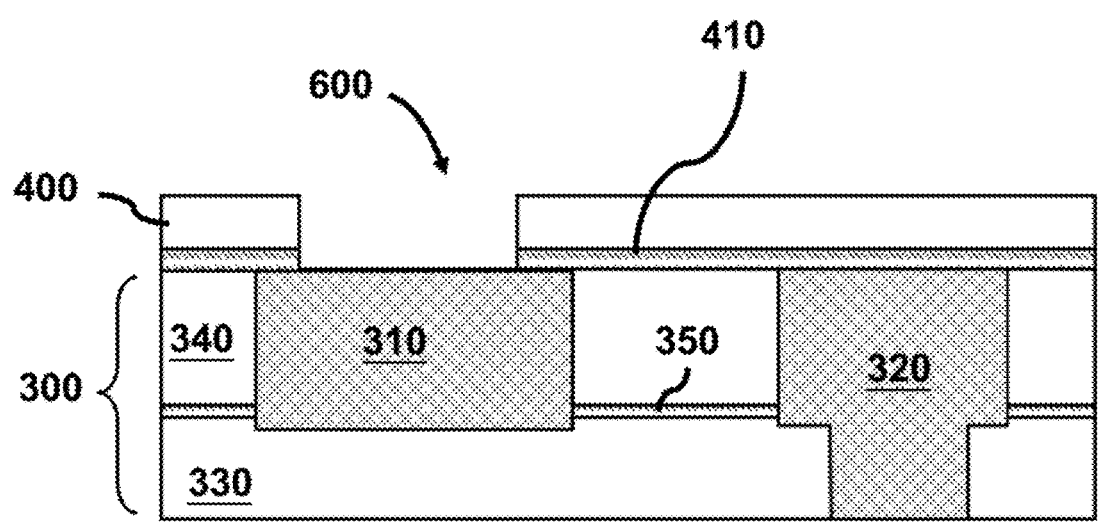
FIG. 7 is a cross-sectional view of an interconnect layer with an etch-stop layer and an interlayer dielectric layer that features a recess according to some embodiments.

In some embodiments, the etch process has high selectivity for ILD layer 400 and etch-stop layer 410. In some embodiments, the etch process automatically stops after a predetermined amount of time. An etch process which is terminated after a predetermined amount of time is referred to as a "timed etch." An "end-pointed" etch process is a process that automatically stops when the layer directly underneath the etched layer is detected; for example, when line 310 is detected. End-point detection is possible because etch-stop layer 410 and the underlying line 310 are made of different materials. Consequently, they can have different etch rates for a given etch chemistry. Detection of line 310 can be done through, for example, a change in the etch rate, which can be detected by in-situ metrology equipment such as, for example, an optical emission microscope. In some embodiments, the etch process may be timed for a first part of the process and end-pointed for a second part of the process. Since the etch process etches different materials (e.g., ILD layer 400 and etch-stop layer 410), different etch chemistry may be used. By way of example and not limitation, an etch chemistry may include a mixture of methane (CH$_4$), trifluoromethane (CHF$_3$), and sulfur hexafluoride (SF$_6$) for etching ILD layer 400. In some embodiments, a mixture of nitrogen (N$_2$), octafluorocyclobutane (C$_4$F$_8$), and argon (Ar) can be used for etching etch-stop layer 410. In addition to the etch chemistry, other etch process parameters can be adjusted (e.g., gas flow rates, plasma power, temperature, and pressure). These parameters can be used to control the etch rate, the etch profile, and etch uniformity. After formation of recess 600, photoresist 510 can be removed (i.e., stripped) with a wet etch as shown in FIG. 7.

Figure 8:
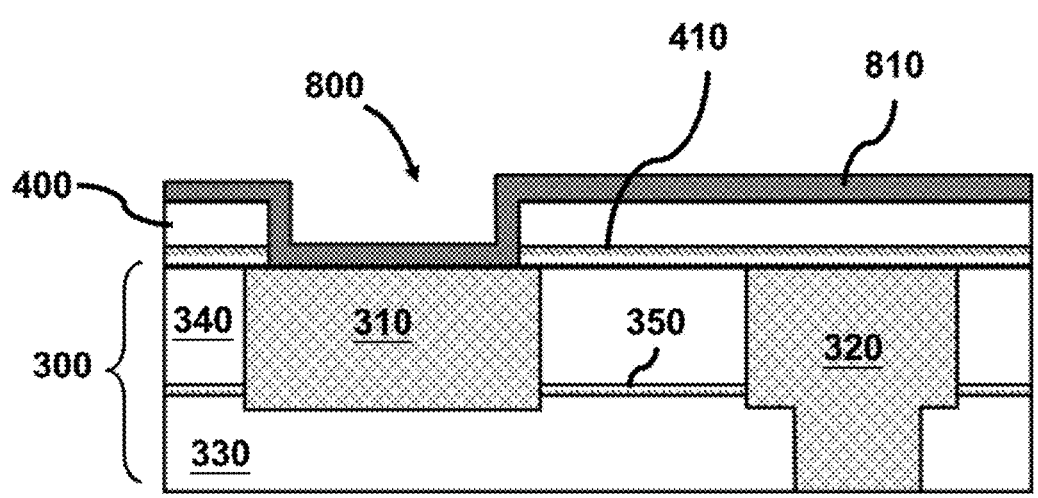
FIG. 8 is a cross-sectional view of an interconnect layer with a recess after deposition of a conductive layer in the recess according to some embodiments.

In referring to FIGS. 2 and 8, in operation 240, a conductive layer 810 is formed in recess 600 (e.g., of FIG. 7) to form a second recess (e.g., recess 800) that is smaller than recess 600. In other words, conductive layer 810 is formed over the exposed surfaces of ILD 400 and line 310 of interconnect layer 300. In some embodiments, conductive layer 810 can be made of Ta and can have a thickness between about 2.5 Å and about 30 Å (e.g., 2.5 to 20 Å, 5 Å to 30 Å, 10 Å to 25 Å). According to some embodiments, thicker Ta layers can be physically possible; however they may cause undesirable RC delays. In some embodiments, conductive layer 810 can be deposited with a CVD or an ALD process at deposition temperatures below about 250° C. A CVD or an ALD process can provide a conformal layer deposition with minimal overhang. However, deposition of conductive layer 810 is not limited to CVD or ALD. For example, conductive layer 810 may also be deposited with a PVD process. By way of example and not limitation, the PVD process can use an argon (Ar) gas plasma that can be generated by a direct current (DC) power generator. In some embodiments, the plasma generator can provide about 2 to about 8 kW of power. The deposition temperature can range between about 100° C. and about 200° C., and the process pressure can range from about 1 to about 5 mTorr. The Ar gas flow during the PVD process can range from about 50 to about 200 sccm (e.g., 50 sccm to 100 sccm, 70 sccm to 150 sccm, 80 sccm to 200 sccm). The above ranges should not be considered limiting and other process ranges may be possible depending on the geometry of the reactor. In some embodiments, conductive layer 810 can block mobile ionic charges that can be generated during the subsequent metal fill deposition process. As a result, the gate oxide's electrical performance, such as the breakdown voltage and leakage current performance, is not adversely impacted.

Figure 9:
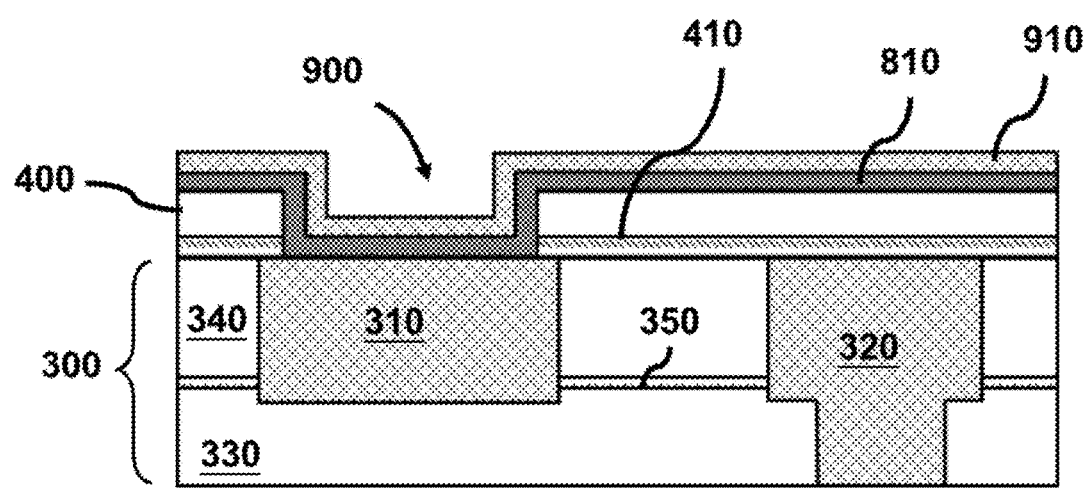
FIG. 9 is a cross-sectional view of an interconnect layer with a recess after deposition of a barrier layer according to some embodiments.

In referring to FIGS. 2 and 9, in operation 250, a barrier layer 910 is formed over conductive layer 810 in recess 800 (e.g., of FIG. 8) to form a third recess (e.g., recess 900) that is smaller than recess 800. In other words, barrier layer 910 is formed over conductive layer 810. In some embodiments, barrier layer 910 can be made of TaN and can have a thickness between about 20 and about 100 nm. In some embodiments, barrier layer 910 can be deposited with a CVD or an ALD process at deposition temperatures below about 250° C. A CVD or an ALD process can provide a conformal layer deposition with minimal overhang. However, deposition of barrier layer 910 may not limited to CVD or ALD. For example, conductive layer 810 may also be deposited with a PVD process. By way of example and not limitation, the PVD process can use an argon (Ar) and nitrogen (N$_2$) plasma mixture which can be generated by a direct current (DC) plasma generator. In some embodiments, the DC plasma generator can provide about 2 to about 8 kW of power. The deposition temperature can range from about 100° C. to about 200° C., and the process pressure can range from about 1 to about 5 mTorr. The Ar gas flow during the PVD process can range from about 50 to about 200 sccm (e.g., 50 sccm to 100 sccm, 70 sccm to 150 sccm, 80 sccm to 200 sccm); and the N$_2$ flow can range from 5 to 50 sccm. The above ranges should not be considered limiting and other process ranges may be possible. In some embodiments, barrier layer 910 can prevent Cu diffusion from the AlCu metal fill.

Figure 10:
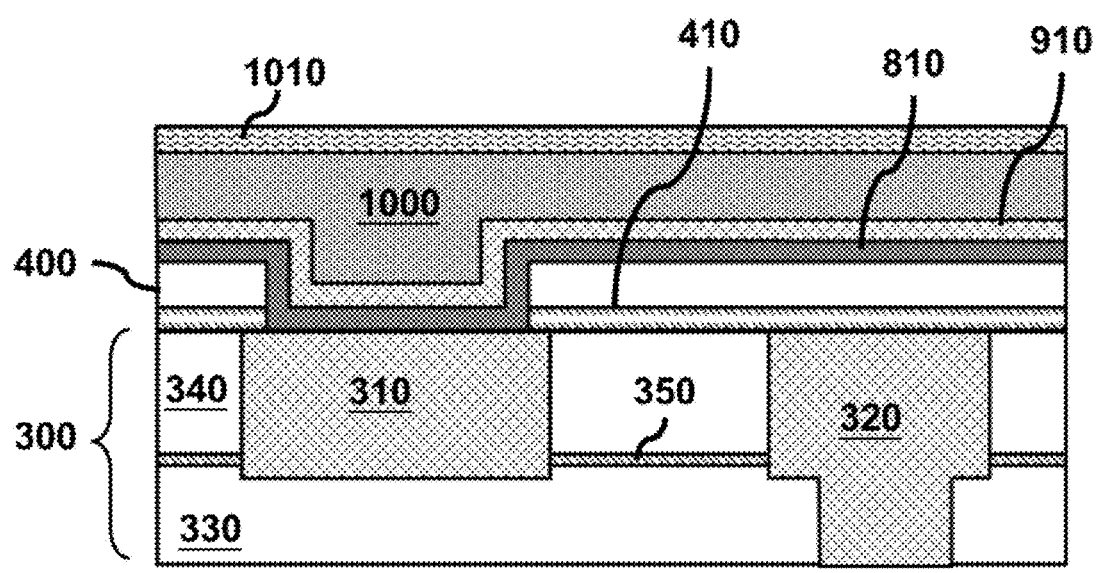
FIG. 10 is a cross-sectional view of an interconnect layer after deposition of a metal fill and a protective layer according to some embodiments.

Method 200 continues with operation 260 and the deposition of a metal fill, such as AlCu, that can fill recess 900 according to some embodiments. A protective silicon oxynitride (SiON) layer can be deposited over the AlCu metal. By way of example and not limitation, the SiON thickness can range from about 20 to about 80 nm and can be deposited by PECVD using SiH$_4$, N$_2$O, N$_2$ and NH$_3$ gasses. Referring to FIG. 10, metal fill 1000 can be AlCu and protective layer 1010 can be the SiON protective layer.

As discussed above, the AlCu can be deposited with a PVD process, e.g., sputtering. By way of example and not limitation, Ar plasma can be used to sputter an alloy target that has a Cu concentration from about 0.1 at. % to about 1.5 at. %. In some embodiments, the power provided to the plasma can be either DC or radio frequency (RF). In some embodiments, due the presence of the Ta layer (e.g., conductive layer 810), the AlCu deposition temperature can be increased above 250° C., and the plasma power can be also increased above 20 kW. In some embodiments the thickness of the AlCu metal fill can range from about 2400 to about 3500 nm (e.g., 2400 nm to 3000 nm, 2700 nm to 3500 nm, 3000 nm to 3500 nm). Due to the increased deposition temperature and plasma power, the grown AlCu metal fill can exhibit larger mean grain size for 95% of the deposited material (e.g., from less than 5 μm to larger than 5 μm) and can show improved gap fill characteristics. In addition, the throughput of the PVD process may also improve.

Figure 11:
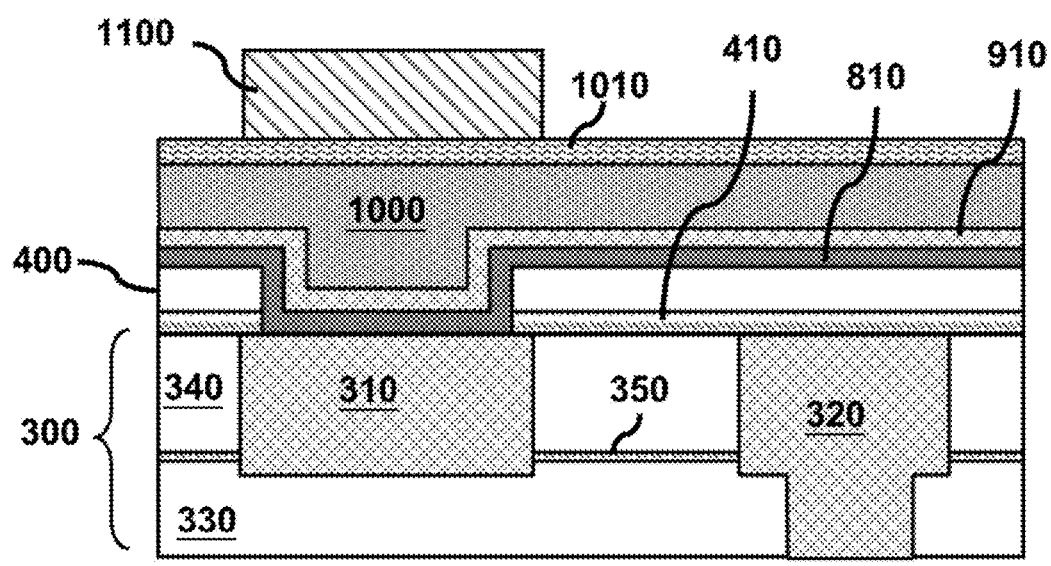
FIG. 11 is a cross-sectional view of an interconnect layer with a metal fill layer and a patterned photoresist layer according to some embodiments.
Figure 12:
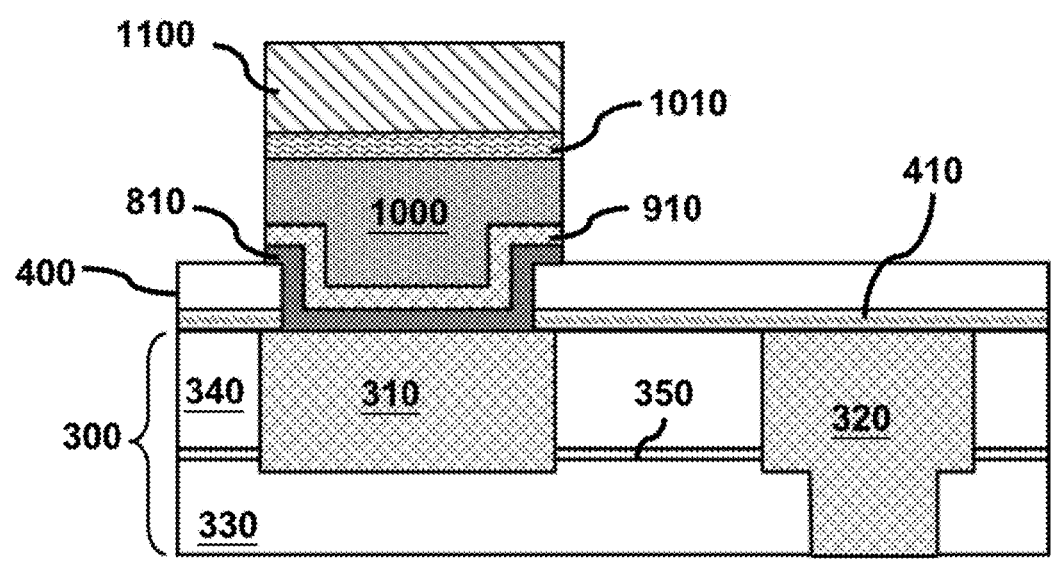
FIG. 12 is a cross-sectional view of an interconnect layer with a metal fill layer and a patterned photoresist layer after an etch operation according to some embodiments.
Figure 13:
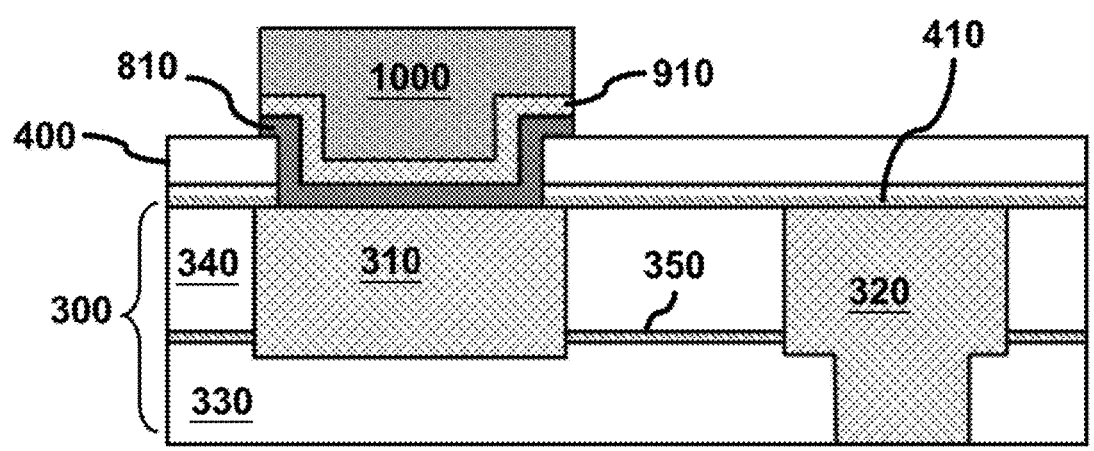
FIG. 13 is a cross-sectional view of an interconnect layer with an bonding pad structure according to some embodiments.

In referring to FIG. 2, in operation 270, the AlCu/SiON stack can be patterned. For example, the patterning process can begin with the application of a photoresist layer over the AlCu/SiON stack. The photoresist can be patterned as discussed above such that a portion of the AlCu/SiON stack above line 310 is covered with photoresist 1100—for example, as shown in FIG. 11. Subsequent etch operations can remove portions of protective layer 1010 and metal fill 1000 that are not covered (e.g., protected) by photoresist 1100—for example, as shown in FIG. 12. After the etch operation, photoresist 1100 and protective layer 1010 can be removed as shown in FIG. 13. This operation concludes the bonding pad structure formation which includes conductive layer 410, barrier layer 910, and metal fill 1000.

Figure 14:
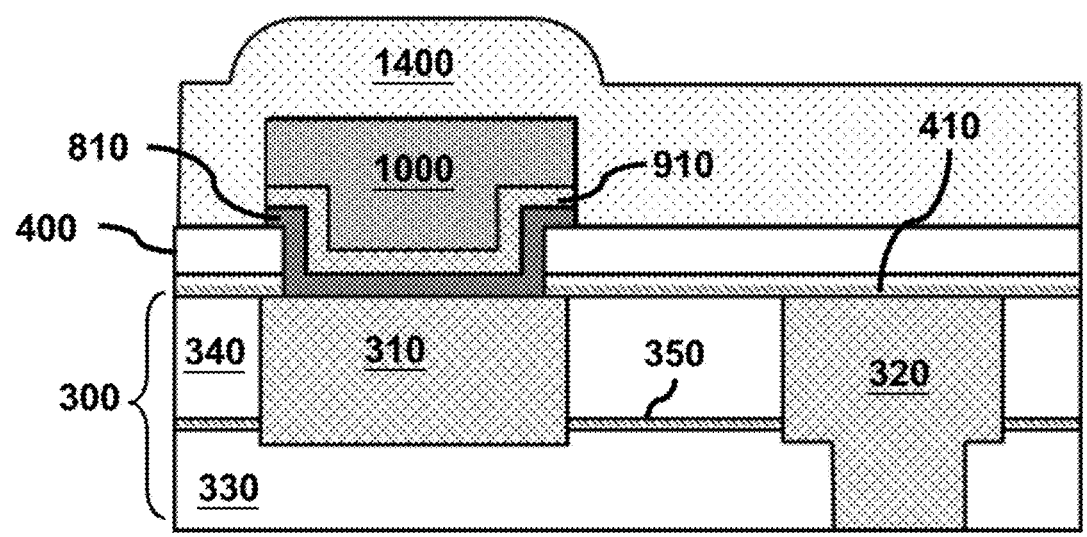
FIG. 14 is a cross-sectional view of an interconnect layer with an bonding pad structure after deposition of a passivation layer according to some embodiments.

In referring to FIG. 2, in operation 280, a passivation layer is formed over the bonding pad structure and ILD layer 400. For example in FIG. 14, passivation layer 1400 is formed over metal fill 1000 and ILD layer 400. In some embodiments, passivation layer 1400 can be a USG/SiN stack with a total thickness of about 400 nm or more (e.g., 500 nm). Passivation layer 1400 is a protective layer that can protect the bonding pad structure and the underlying layers from moisture, scratches, and contamination.

The embodiments described herein are directed to a bonding pad formation method that introduces a Ta conductive layer prior to the metal fill (e.g., AlCu) deposition. In some embodiments, the Ta conductive layer can block mobile ionic charges generated during the metal fill deposition. As a result, the electrical characteristics of underlying transistors, such as the breakdown voltage and leakage current performance, are not adversely impacted. In some embodiments, due the presence of the Ta layer, the AlCu deposition temperature can be increased above 250° C., and the plasma power during deposition can increase above 20 kW. As a result, the grown AlCu metal fill, under the aforementioned conditions, can exhibit larger mean grain size for 95% of the deposited material (e.g., from smaller than 5 μm to larger than 5 μm) and improved AlCu gap fill characteristics. In addition, the throughput of the AlCu PVD process may also improve.

In some embodiments, a method includes one or more interconnect layers are formed over a substrate, and a dielectric over a top interconnect layer of the one or more interconnect layers. A first recess is formed in the dielectric to expose a line or a via from the top interconnect layer. A conductive layer is formed in the first recess to form a second recess that is smaller than the first recess. A barrier metal layer is formed in the second recess to form a third recess that is smaller than the second recess. A metal is formed to fill the third recess.

In some embodiments, a structure includes a substrate, a dielectric over the substrate with a first metal embedded in the dielectric. An etch-stop layer formed over the dielectric and over a portion of the first metal. A conductive layer formed over a portion of first metal and over a portion of the etch-stop layer and a metal barrier formed over the conductive layer. A second metal formed over the metal barrier.

In some embodiments, a method includes a substrate with a dielectric formed over the substrate with a first metal embedded in the dielectric. An etch-stop layer formed over the dielectric and over a portion of the first metal. A conductive layer is formed over a portion of first metal and over a portion of the etch-stop layer and a metal barrier is formed over the second metal. Further a second metal is formed over the metal barrier.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming one or more interconnect layers over a substrate;
    forming a dielectric over a top interconnect layer of the one or more interconnect layers;
    forming a first recess in the dielectric to expose a line or a via from the top interconnect layer;
    forming a conductive layer in the first recess to form a second recess that is smaller than the first recess;
    forming a barrier nitride layer in the second recess to form a third recess that is smaller than the second recess;
    forming a metal to fill the third recess, while exposing top and side surfaces of the metal; and
    forming a passivation layer in contact with the top and side surfaces of the metal.

2. The method of claim 1, wherein the conductive layer comprises tantalum (Ta) with a thickness between 2.5 Å and 30 Å.

3. The method of claim 1, wherein the forming the conductive layer comprises forming the conductive layer using a physical vapor deposition process with a deposition temperature between 100° C. and 200° C., a process pressure between 1 and 5 mTorr, and a DC plasma power between 2 and 8 kW.

4. The method of claim 1, wherein the metal comprises aluminum-copper with a copper concentration of 0.1 to 1.5 atomic percent.

5. The method of claim 1, wherein the forming the metal comprises forming the metal using a physical vapor deposition process with a deposition temperature between 250° C. and 450° C., a process pressure between 2 and 10 mTorr, and a DC plasma power between 20 and 60 kW.

6. A structure, comprising:
    a substrate;
    a dielectric over the substrate;
    a first metal embedded in the dielectric;
    an etch-stop layer over the dielectric and over a portion of the first metal;
    a conductive layer over a portion of the etch-stop layer and in contact with the first metal;
    a barrier nitride layer over the conductive layer;
    a second metal over the barrier nitride layer; and
    a passivation layer over the second metal and the dielectric, wherein the passivation layer is in contact with side surfaces of the second metal.

7. The structure of claim 6, wherein the conductive layer comprises tantalum (Ta) with a thickness between 2.5 Å and 30 Å.

8. The structure of claim 6, wherein the second metal comprises aluminum-copper with a copper concentration of 0.1 to 1.5 atomic percent.

9. The structure of claim 6, wherein the second metal has a grain size average larger than 5 μm.

10. The structure of claim 6, wherein the second metal has a grain size distribution between 5 μm and 20 μm.

11. The structure of claim 6, wherein the second metal has a thickness between 2400 nm to 3500 nm.

12. The structure of claim 6, wherein the barrier nitride layer comprises tantalum nitride.

13. The structure of claim 6, wherein the first metal comprises a line or a via.

14. The structure of claim 6, wherein the first metal comprises copper.

15. A method, comprising:
providing a substrate;
forming a dielectric over the substrate;
forming a first metal embedded in the dielectric;
forming an etch-stop layer over the dielectric and over a portion of the first metal;
forming a conductive layer over a portion of the etch-stop layer and in contact with the first metal;
forming a barrier nitride layer over the conductive layer;
forming a second metal over the barrier nitride layer; and
forming a passivation layer over the second metal and in contact with side surfaces of the second metal.

16. The method of claim 15, wherein the forming the second metal comprises forming the second metal using a physical vapor deposition process with a deposition temperature between 250° C. and 450° C., a process pressure between 2 and 10 mTorr, and a DC plasma power between 20 and 60 kW.

17. The method of claim 15, wherein the forming the conductive layer comprises forming the conductive layer using a physical vapor deposition process with a deposition temperature between 100° C. and 200° C., a process pressure between 1 and 5 mTorr, and a DC plasma power between 2 and 8 kW.

18. The structure of claim 6, wherein the passivation layer comprises an undoped silicate glass layer or a silicon nitride layer.

19. The method of claim 1, wherein forming the metal to fill the third recess comprises:
forming the metal over the barrier nitride layer, the conductive layer, and the dielectric;
forming a protective layer over the metal;
forming a photoresist over the protective layer; and
removing a portion of the protective layer and the metal using the photoresist.

20. The method of claim 15, further comprising:
forming a protective layer over the second metal;
forming a photoresist over the protective layer; and
removing a portion of the protective layer, the second metal, the barrier nitride layer, and the conductive layer using the photoresist.

* * * * *